United States Patent
Park et al.

(10) Patent No.: US 7,855,366 B2
(45) Date of Patent: Dec. 21, 2010

(54) BIPOLAR JUNCTION TRANSISTOR-BASED UNCOOLED INFRARED SENSOR AND MANUFACTURING METHOD THEREOF

(75) Inventors: Kun Sik Park, Daejeon (KR); Yong Sun Yoon, Daejeon (KR); Bo Woo Kim, Daejeon (KR); Jin Yeong Kang, Daejeon (KR); Jong Moon Park, Daejeon (KR); Seong Wook Yoo, Daegu (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 290 days.

(21) Appl. No.: 12/111,830

(22) Filed: Apr. 29, 2008

(65) Prior Publication Data

US 2009/0321641 A1  Dec. 31, 2009

(30) Foreign Application Priority Data

Oct. 31, 2007  (KR) .................... 10-2007-0110150

(51) Int. Cl.
  *G01J 5/20* (2006.01)
(52) U.S. Cl. .................................. 250/338.4
(58) Field of Classification Search ............... 250/338.1, 250/338.3, 338.4; 438/54, 57
  See application file for complete search history.

(56) References Cited

U.S. PATENT DOCUMENTS

| 2002/0039838 A1 | 4/2002 | Iida et al. |
| 2002/0190210 A1* | 12/2002 | Ishikawa et al. ......... 250/338.4 |
| 2005/0224714 A1 | 10/2005 | Akin et al. |
| 2006/0244067 A1 | 11/2006 | Socher et al. |

FOREIGN PATENT DOCUMENTS

| JP | 11-287713 A | 10/1999 |
| JP | 2002-286552 A | 10/2002 |
| JP | 2007-225398 A | 9/2007 |

OTHER PUBLICATIONS

Tomohiro Ishikawa, et al. "Performance of 320×240 Uncooled IRFPA with SOI Diode Detectors" Proc. SPIE, vol. 4130 (2000).

* cited by examiner

*Primary Examiner*—David P Porta
*Assistant Examiner*—Mark R Gaworecki

(57) ABSTRACT

A BJT (bipolar junction transistor)-based uncooled IR sensor and a manufacturing method thereof are provided. The BJT-based uncooled IR sensor includes: a substrate; at least one BJT which is formed to be floated apart from the substrate; and a heat absorption layer which is formed on an upper surface of the at least one BJT, wherein the BJT changes an output value according heat absorbed through the heat absorption layer. Accordingly, it is possible to provide a BJT-based uncooled IR sensor capable of being implemented through a CMOS compatible process and obtaining more excellent temperature change detection characteristics.

4 Claims, 19 Drawing Sheets

BIPOLAR JUNCTION TRANSISTOR-BASED UNCOOLED INFRARED SENSOR AND MANUFACTURING METHOD THEREOF

CROSS-REFERENCE TO RELATED APPLICATIONS

This application claims the priority of Korean Patent Application No. 10-2007-110150 filed on Oct. 31, 2007, in the Korean Intellectual Property Office, the disclosure of which is incorporated herein by reference.

BACKGROUND OF THE INVENTION

1. Field of the Invention

The present invention relates to an uncooled infrared (IR) imaging apparatus, and more particularly, to a bipolar junction transistor (BJT)-based uncooled IR sensor capable of being implemented through a complementary metal oxide semiconductor (CMOS) compatible process and improving temperature change detection characteristics.

2. Description of the Related Art

Recently, uncooled IR sensors has been actively researched and developed in terms of advantages such as a low production cost, a light weight, a low operating voltage, and a wide IR frequency band, etc. The applications of the uncooled IR sensors have been widened into a night IR imaging apparatus for a vehicle, an IR scope for a game machine, a security camera, thermal analysis, fire detection, and the like.

Particularly, in case of a CMOS process compatible IR sensor, since peripheral circuits such as a read-out integrated circuit (ROIC) can be formed on the same substrate for the IR sensor, a monolithic IR detection system can be implemented.

Therefore, a production cost can be greatly reduced, and operating characteristics such as noise reduction and an increase in signal processing speed can be improved.

On the other hand, various technologies for forming micro-bolometers on a substrate where the CMOS ICs are formed by using a surface micro-machining process to implement the uncooled IR sensor have been proposed.

In general, the micro-bolometers have a structure where the micro-bolometers are formed to be floated apart from the substrate in order to remove thermal noise caused from heat of the substrate. In addition, the micro-bolometers are constructed with heat absorption layers which absorb the heat and heat detection devices which detect a change in heat and change resistance thereof with a high temperature coefficient of resistance (TCR).

As an example of a heat detection device having a high TCR, there are VOx, polycrystalline SiGe, amorphous silicon, YBaCuO, and various metallic resistors, etc.

However, the VOx is not compatible with a CMOS process, but many additional processes as well as the CMOS process are needed. Accordingly, apparatuses for depositing the VOx and post-processing apparatus after the deposition of VOx are additionally needed, so that the production cost is increased.

In addition, due to an amorphous structure of the VOx, a low frequency noise is increased.

On the other hand, the polycrystalline SiGe or the amorphous silicon is compatible with the CMOS process. However, since a high-temperature heat treatment process for ensuring stability of resistor is additionally needed, the polycrystalline SiGe or the amorphous silicon cannot be integrated into a CMOS IC in a monolithic type. In addition, due to an amorphous characteristic, a low frequency noise is increased. In addition, many additional processes such as thin film deposition, photolithography, and etching are needed.

In order to solve the aforementioned problems, a technology for implementing the heat detection device of the micro-bolometers by using PN diodes shown in FIG. 1 has been proposed.

According to some research, in temperature change detection characteristics of the uncooled IR sensor implemented by using the PN diode as the heat detection device, a rate of change in voltage according to a temperature is in a range of 1 to 3 mV/K. The value is much more excellent than the value of a silicon thermocouple, that is, in a range of 0.5 to 1 mV/K.

In addition, the PN diode sensor is compatible with a silicon CMOS process, and a minimum of additional process after the CMOS process is needed.

SUMMARY OF THE INVENTION

The resistor-based uncooled IR sensor such as $VO_x$ and polycrystalline SiGe has temperature change detection characteristics of 20 to 30 mV/K (2 to 3%/K at an operating voltage of 1V). However, the PN diode-based uncooled IR sensor has a disadvantage in terms of the temperature change detection characteristics of 1 to 3 mV/K (0.1 to 0.3%/K at an operating voltage of 1V).

Therefore, similar to the PN diode-based uncooled IR sensor, an uncooled IR sensor capable of being implemented through a CMOS compatible process and obtaining excellent temperature change detection characteristics has been required.

According to an aspect of the present invention, there is provided a BJT (bipolar junction transistor)-based uncooled IR sensor comprising: a substrate; at least one BJT which is formed to be floated apart from the substrate; and a heat absorption layer which is formed on an upper surface of the at least one BJT, wherein the BJT changes an output value according heat absorbed through the heat absorption layer.

In the above aspect, in the at least one BJT, a base may be applied with a constant voltage (constant current), a collector may be applied with a constant voltage, and a current flowing through the collector may be changed according to heat absorbed through the heat absorption layer. In addition, in the at least one BJT, a base may be applied with a constant voltage, a collector may be applied with a constant current, and a voltage applied to the collector may be changed according to heat absorbed through the heat absorption layer.

According to another aspect of the present invention, there is provided a method of manufacturing a BJT (bipolar junction transistor)-based uncooled IR sensor, comprising: forming a BJT in a substrate; forming a heat absorption layer on an upper surface of the BJT; and etching the upper surface of the substrate contacting with a lower surface of the BJT so as for the BJT to be floated.

In the above aspect, the forming of the BJT may comprise: forming a well in the substrate; forming a base region in the well; forming a base and an emitter in the base region to be separated from each other; and forming a collector in the well where the base region is not formed.

In addition, the forming of the heat absorption layer may comprise: forming metal interconnection lines connected to the base, the emitter, and the collector; depositing an insulating layer on the upper surface of the substrate so as to cover the metal interconnection lines; and etching the insulating layer to form the heat absorption layer including the metal interconnection lines and the insulating layer.

In addition, the method may further comprise forming a support arm on the upper surface of the substrate so as to support the IR sensor.

According to still another aspect of the present invention, there is provided a method of manufacturing a BJT (bipolar junction transistor)-based uncooled IR sensor, comprising: etching a wafer including a substrate and an epitaxial layer to form a membrane structure; forming a BJT in the epitaxial layer; forming a heat absorption layer constructed with metal interconnection lines and an insulating layer by forming the metal interconnection lines on an upper surface of the BJT and depositing the insulating layer to cover the metal interconnection lines; and etching the insulating layer where the BJT and the heat absorption layer are not formed and the epitaxial layer to form a cantilever structure.

In the above aspect, the forming the BJT may comprise: forming a base region in the epitaxial layer; forming a first emitter, a base, and a second emitter in the base region to be separated from each other; and forming a collector in the epitaxial layer where the base region is not formed.

In addition, the forming of the heat absorption layer may comprise: forming the metal interconnection lines to be connected to the base, the first and second emitters, and the collector; and depositing the insulating layer on the upper surface of the wafer to cover the metal interconnection lines.

In addition, the etching of the insulating layer to form the cantilever structure may comprise: defining an opening region of the cantilever on a region of the insulating layer where the BJT and the heat absorption layer are not formed; etching the insulating layer through the opening region of the cantilever and etching the epitaxial layer by a thickness of the cantilever; and etching the epitaxial layer through a lower surface of the wafer to penetrate the insulating layer, the epitaxial layer, and the substrate.

According to a further still another aspect of the present invention, there is provided a method of manufacturing a BJT (bipolar junction transistor)-based uncooled IR sensor, comprising: forming a BJT in an SOI (silicon-on-insulator) wafer; forming a heat absorption layer on an upper surface of the BJT; and etching an upper surface of the SOI wafer contacting with a lower surface of the BJT so as for the BJT to be floated.

In the above aspect, the forming of the BJT may comprise: forming a well in the SOI wafer; forming a base region in the well; forming a base and an emitter in the base region to be separated from each other; and forming a collector in the well where the base region is not formed.

In addition, the forming of the heat absorption layer may comprise: forming metal interconnection lines to be connected to the base, the emitter, and the collector; depositing an insulating layer on an upper surface of the SOI wafer to cover the metal interconnection lines; forming a heat absorption layer constructed with the metal interconnection lines and the insulating layer by defining a heat absorption layer formation region and etching the insulating layer formed in the heat absorption layer formation region.

In addition, the method may further comprise forming a support arm on an upper surface of the substrate to support the IR sensor.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE PREFERRED EMBODIMENT

Figure 1:
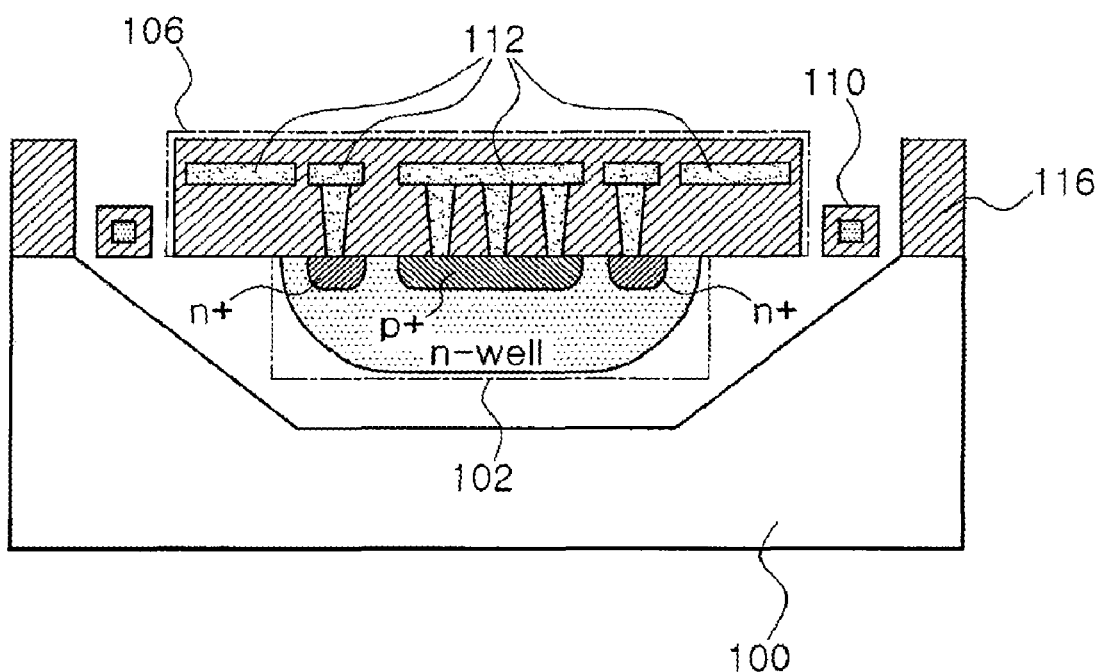
FIG. 1 is a cross-sectional view illustrating a conventional PN diode-based uncooled IR sensor.

Hereinafter, embodiments of the present invention will be described in detail with reference to the accompanying drawings. For clarifying the present invention, detailed description of well-known functions and constructions will be omitted.

In the accompanying drawing, elements having similar functions and operations are denoted by the same reference numerals.

Figure 2:
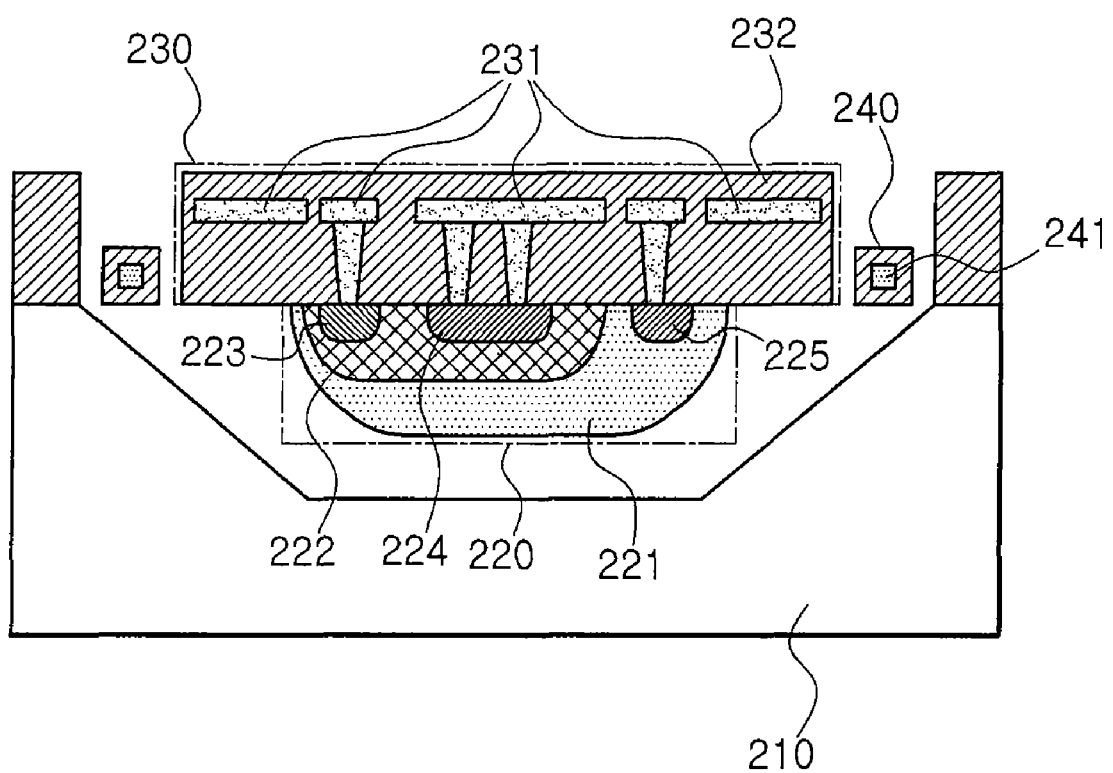
FIG. 2 is a cross-sectional view illustrating a BJT-based uncooled IR sensor according to an embodiment of the present invention.

FIG. 2 is a cross-sectional view illustrating a BJT-based uncooled IR sensor according to an embodiment of the present invention.

Referring to FIG. 2, the uncooled IR sensor mainly includes a silicon substrate 210, a bipolar junction transistor (BJT) 220 which is floated apart from the silicon substrate 210 and changes a voltage or current value according to heat absorbed through a heat absorption layer 230, the heat absorption layer 230 which is disposed on an upper surface of the BJT 220 to absorb the heat, and a support arm 240 which fixes a position of the BJT 220.

That is, in the uncooled IR sensor of FIG. 2, a heat detection device is implemented with the BJT instead of a conventional PN diode.

The BJT 220 is applied with a constant voltage through a collector and with a constant voltage (constant current) through a base to change a collector current value according to a temperature of the heat absorption layer 230. Otherwise, the BJT 200 is applied with a constant current through the collector and a constant voltage (constant current) through the base to change the collector voltage value according to the temperature of the heat absorption layer 230.

The BJT 220 can detect a change in temperature of the heat absorption layer 230 by using an n-p-n or p-n-p junction characteristic, so that it is possible to obtain excellent temperature change detection characteristics. In addition, due to the BJT 220, output signals can be stably detected in a wide range of operating voltage, and a silicon CMOS process compatible IR sensor can be manufactured.

As a result, the uncooled IR sensor of FIG. 2 can be integrated with a CMOS IC in a monolithic type and provide more excellent temperature change detection characteristics than a conventional uncooled IR sensor.

Now, a method of manufacturing the uncooled IR sensor having the structure of FIG. 2 will be described with reference to FIGS. 3A to 3D.

Figure 3A:
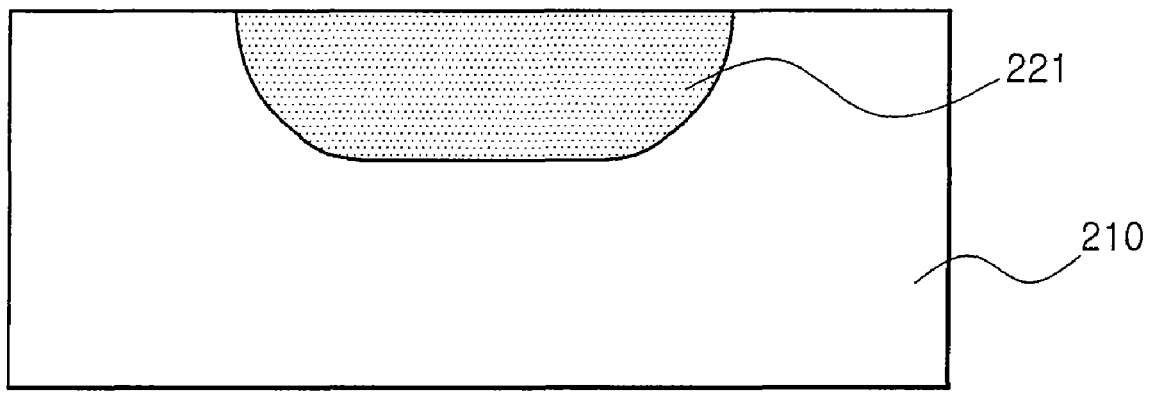
FIGS. 3A to 3D are cross-sectional views for explaining a method of manufacturing an uncooled IR sensor having the structure of FIG. 2.

Firstly, as shown in FIG. 3A, an n-type well 221 is formed in a predetermined region of a p-type silicon substrate 210.

Figure 3B:
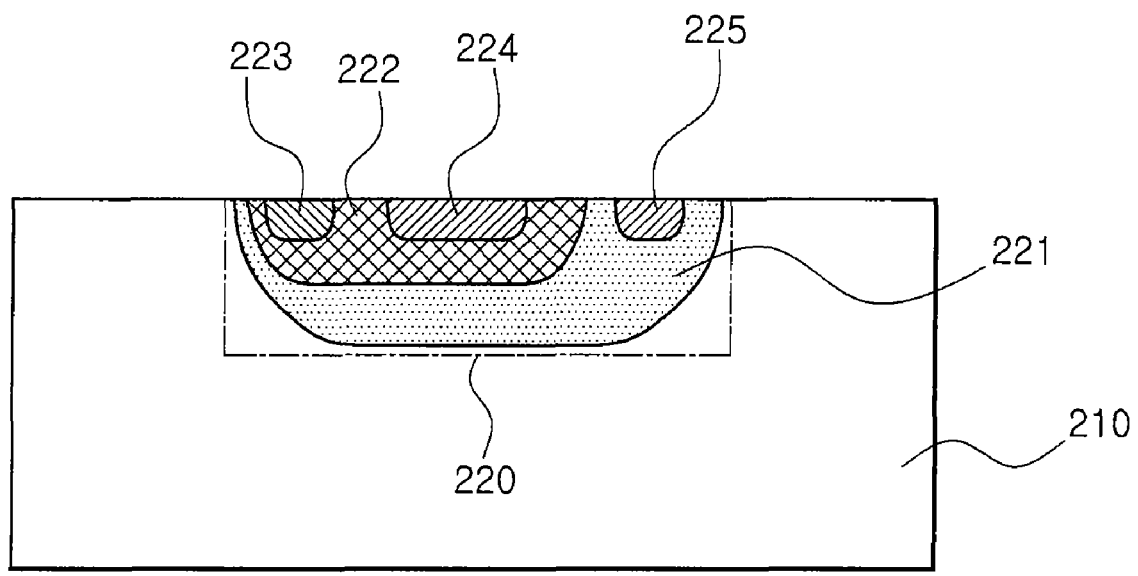

Next, as shown in FIG. 3B, a p-type base region 222 is formed in the n-type well 221 through a p-type base ion implantation process and a diffusion process. Next, a p-type base 223 and an n-type emitter 224 are formed in the p-type base region 222 to be separated by a predetermined distance from each other through p+ active and n+ active ion implantation processes, respectively. Next, an n-type collector 225 is formed in the n-type well 221 where the p-type base region 222 is not formed.

As a result, the BJT 220 is formed to have an n+/p-type base/n-type well structure.

Figure 3C:
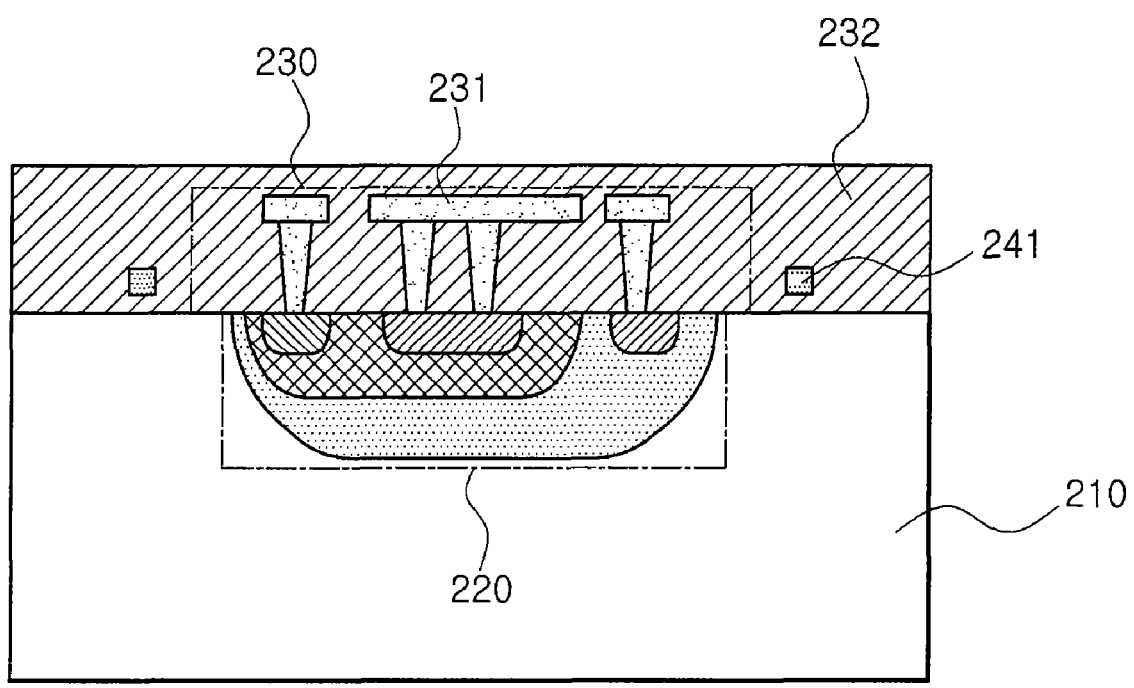

Subsequently, as shown in FIG. 3C, metal interconnection lines 231 are formed to be connected to the p-type base 223, the n-type emitter 224, and the n-type collector 225 through a metal interconnection process. Polysilicons 241 used to form support arms 240 for supporting the to-be-floated IR sensor are formed on both sides of metal interconnection lines 231. A passivation insulating layer 232 is deposited on the upper surface of the substrate 210 so as to cover the polysilicons 241 and the metal interconnection lines 231.

The insulating layer 232 may be made of a silicon oxide film, a silicon nitride, a metal such as aluminum, and other materials such as bismuth.

Figure 3D:
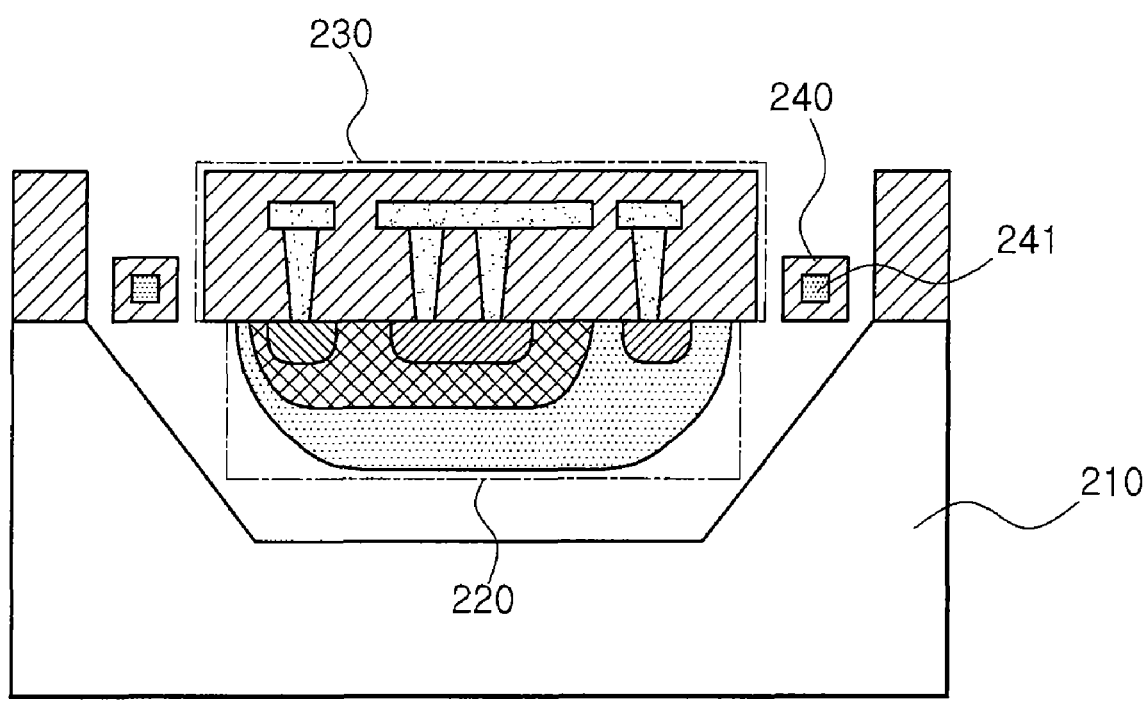

Next, as shown in FIG. 3D, opening regions are defined on the insulating layer 232 through a photolithography process, and dry etching is performed to form the heat absorption layer 230 constructed with the metal interconnection lines 231 and the insulating layer 232 and the support arms 240 constructed with the polysilicons 241 and the insulating layer 232.

Next, an anisotropic wet etching process is electro-chemically performed on the upper surface of the substrate 210 contacting with lower surfaces of the BJT 220 and the support arm 240, so that the BJT 220 is formed to be floated apart from the substrate 210.

As a result, an IR sensor structure including the BJT 220 and the heat absorption layer 230 can be floated apart from the substrate 210.

In the aforementioned embodiment, the support arm 240 is constructed in a combination of the polysilicon 241 and the insulating layer 232. Alternatively, the support arm 240 may be constructed with only the insulating layer 232.

Figure 4:
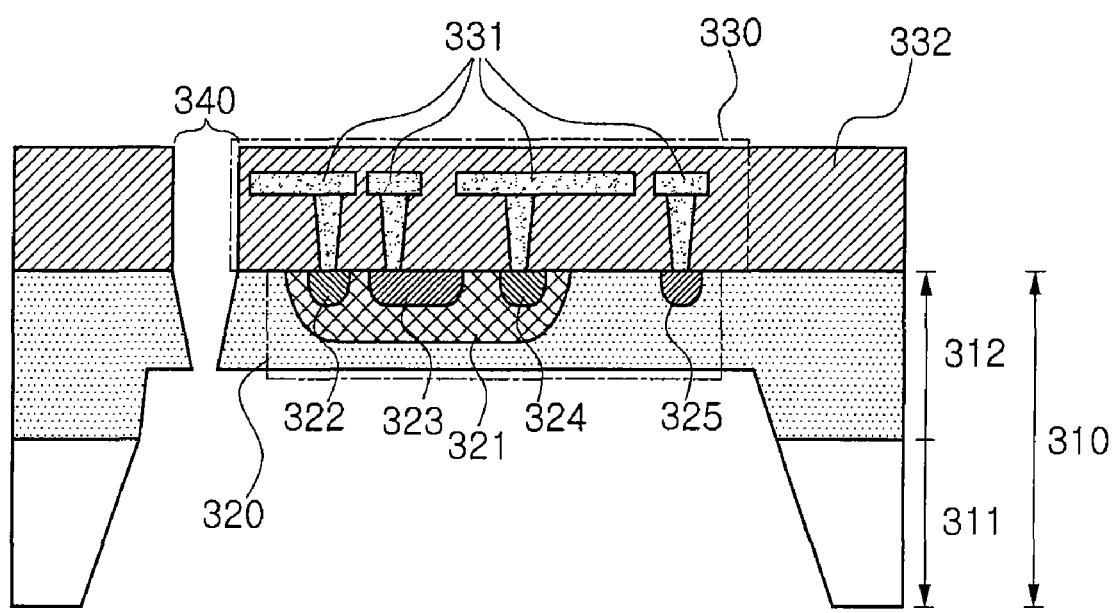
FIG. 4 is a cross-sectional view illustrating a BJT-based uncooled IR sensor according to another embodiment of the present invention.

FIG. 4 is a cross-sectional view illustrating a BJT-based uncooled IR sensor according to another embodiment of the present invention.

Similarly to the uncooled IR sensor of FIG. 2, the uncooled IR sensor of FIG. 4 includes a substrate 311, an epitaxial layer 312, a BJT 320 formed in the epitaxial layer 312, and a heat absorption layer 330 formed on an upper surface of the BJT 320. Particularly, in the embodiment, the BJT 320 is formed on a cantilever structure of the epitaxial layer 312 so that the BJT 320 can be thermally isolated from the substrate 311.

That is, the uncooled IR sensor of FIG. 4 is implemented by using a wafer 310 where the n-type epitaxial layer 312 is formed on the p-type silicon substrate 311.

Now, a method of manufacturing the uncooled IR sensor having the structure of FIG. 4 will be described with reference to FIGS. 5A to 5D.

Figure 5A:
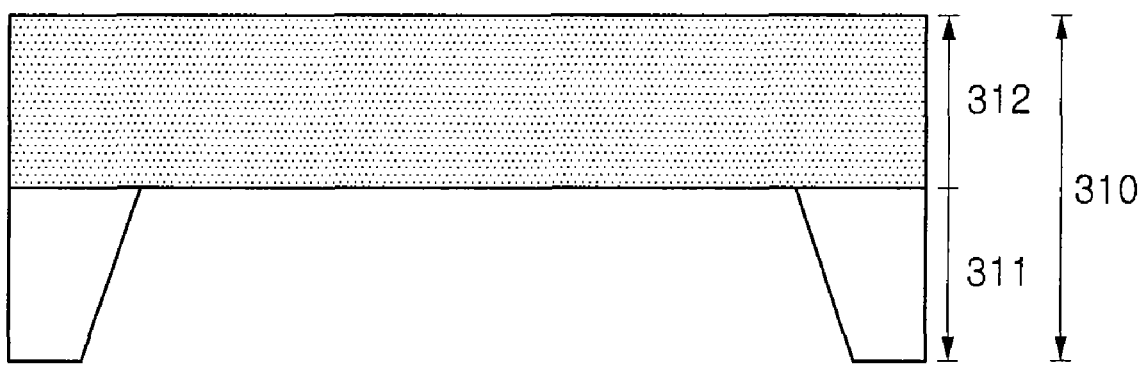
FIGS. 5A to 5D are cross-sectional views for explaining a method of manufacturing an uncooled IR sensor having the structure of FIG. 4.

Firstly, as shown in FIG. 5A, an anisotropic etching process using chemicals such as KOH is performed on a lower surface of the silicon substrate 311 so as to form a membrane structure.

Figure 5B:
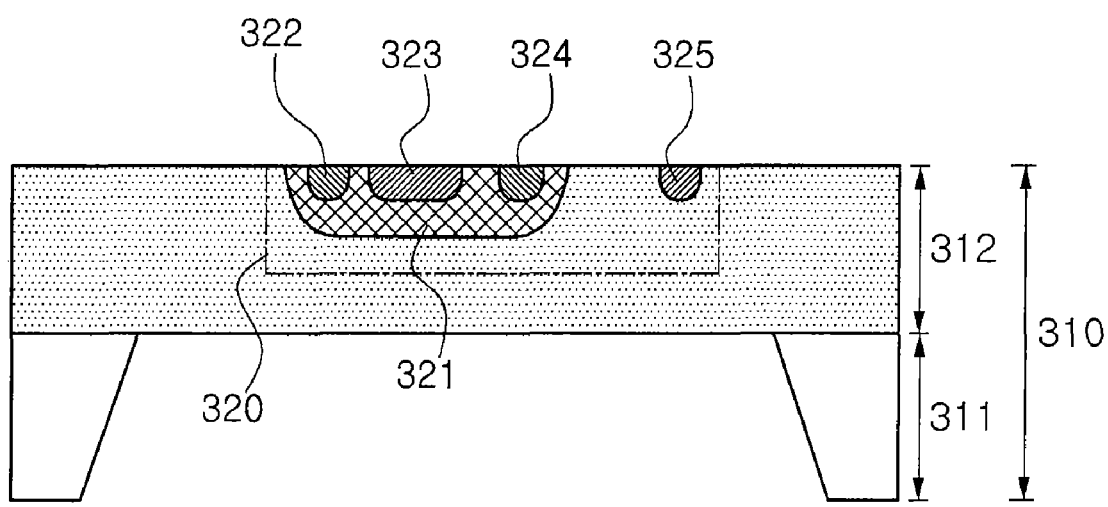

Next, as shown in FIG. 5B, a p-type base region 321 is formed in the n-type epitaxial layer 312 through a p-type base ion implantation process and a diffusion process. Next, an n-type emitter 322, a p-type base 323, and an n-type emitter 324 are formed in the p-type base region 321 through n+ active and p+ active ion implantation processes. Next, an n-type collector 325 is formed in the n-type epitaxial layer 312 where the p-type base region 321 is not formed.

As a result, the BJT 320 is formed to have an n+/p-type base/n-type epitaxial layer structure.

Figure 5C:
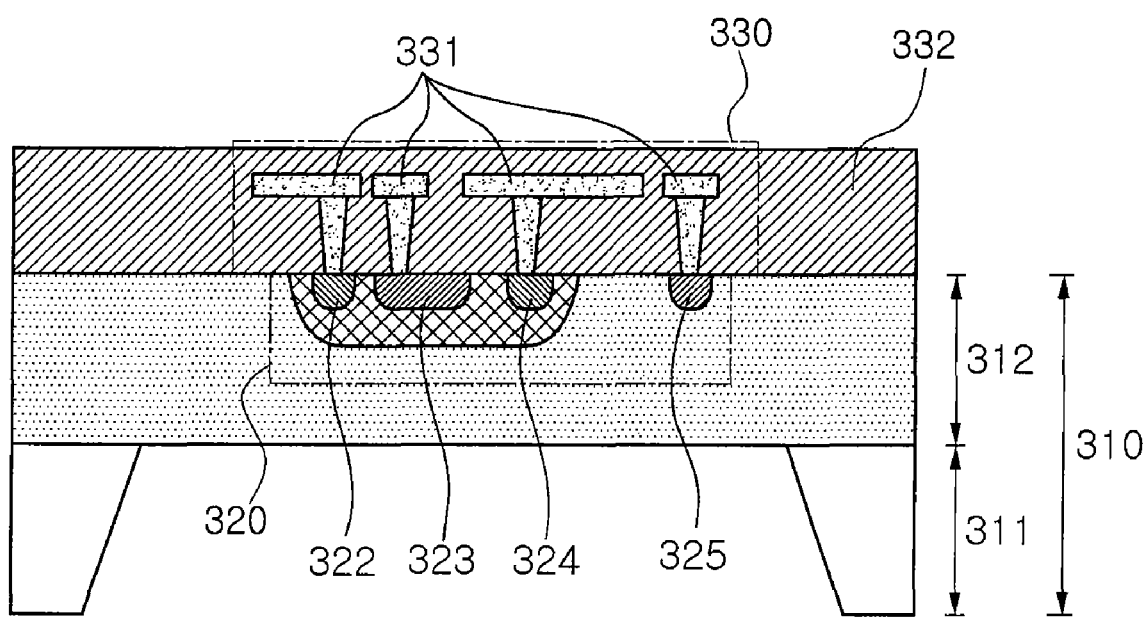

Next, as shown in FIG. 5C, metal interconnection lines 331 are formed to be connected to the p-type base 323, the n-type emitters 322 and 324, and the n-type collector 325 through a metal interconnection process. A passivation insulating layer 332 is deposited on the upper surface of the n-type epitaxial layer 312 so as to cover the metal interconnection lines 331.

Figure 5D:
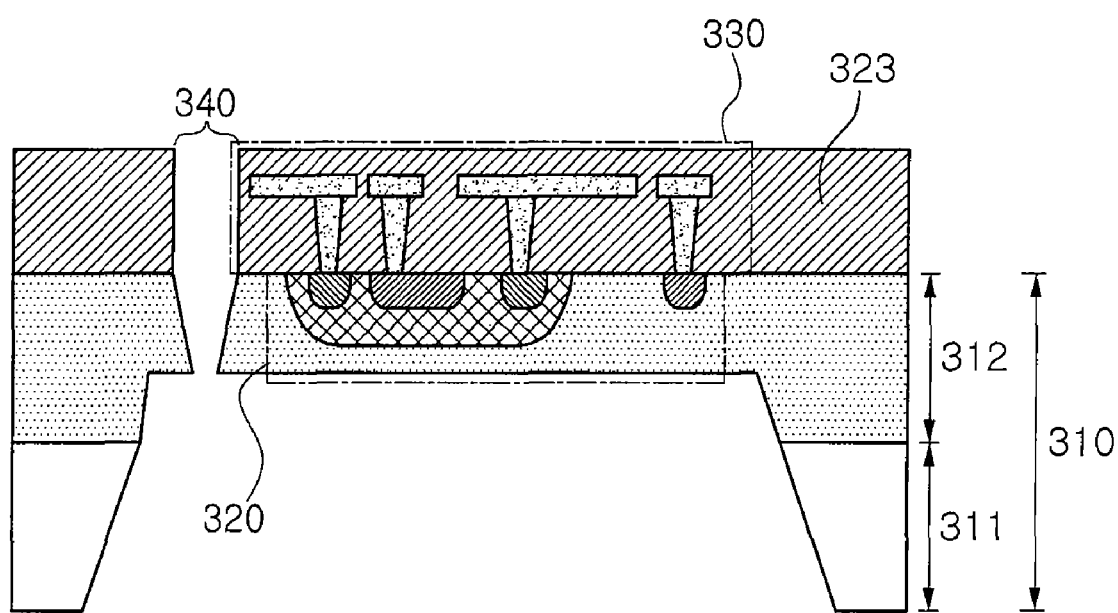

Next, as shown in FIG. 5D, in order to a cantilever structure from the membrane structure, a cantilever opening region 340 is defined, and the insulating layer 332 deposited on a portion corresponding to the opening region 340 is etched. Subsequently, the epitaxial layer 312 is etched by a thickness of the cantilever.

Next, a lower surface of the epitaxial layer 312 is etched to penetrate the cantilever opening region 340. As a result, an IR sensor including the BJT 320 and the heat absorption layer 330 is formed to have the cantilever structure, so that the IR sensor can be thermally isolated from the substrate 311.

Figure 6:
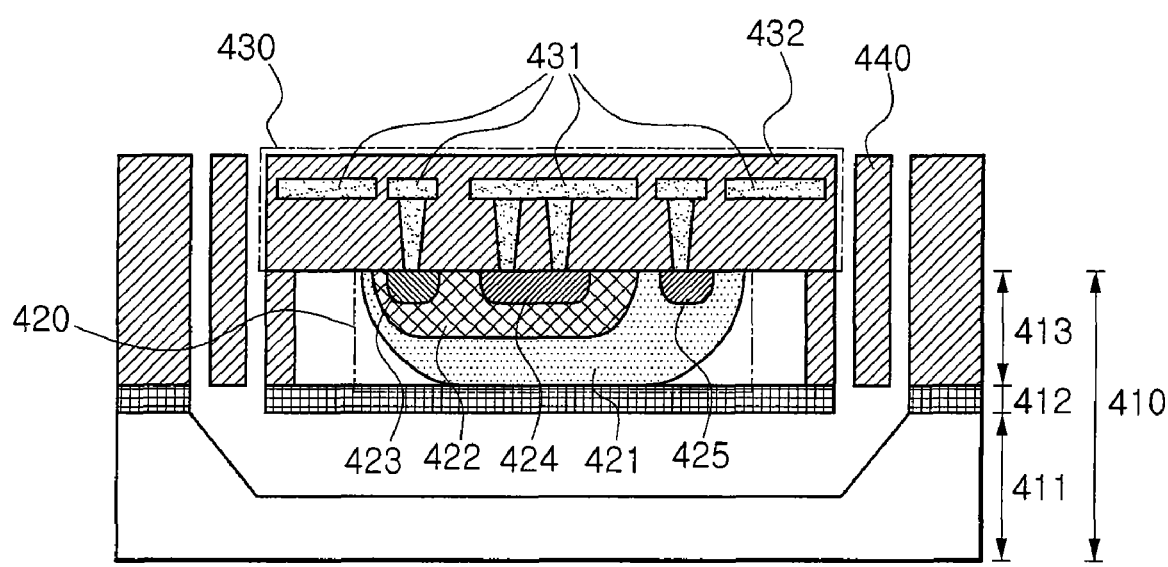
FIG. 6 is a cross-sectional view illustrating a BJT-based uncooled IR sensor according to still another embodiment of the present invention.

FIG. 6 is a cross-sectional view illustrating a BJT-based uncooled IR sensor according to still another embodiment of the present invention.

Similar to the uncooled IR sensor of FIG. 2, the uncooled IR sensor of FIG. 6 includes a substrate 410, a BJT 420, a heat absorption layer 430, and a support arm 440. In here, the substrate 410 is constructed with a silicon-on-insulator (SOI) wafer.

Now, a method of manufacturing the uncooled IR sensor having the structure of FIG. 6 will be described with reference to FIGS. 7A to 7D.

For the convenience of description, in FIGS. 7A to 7D, an SOI wafer 410 manufactured by sequentially laminating a silicon substrate 411, a buried oxide (BOX) 412, and a p-type silicon 413 is exemplified.

Figure 7A:
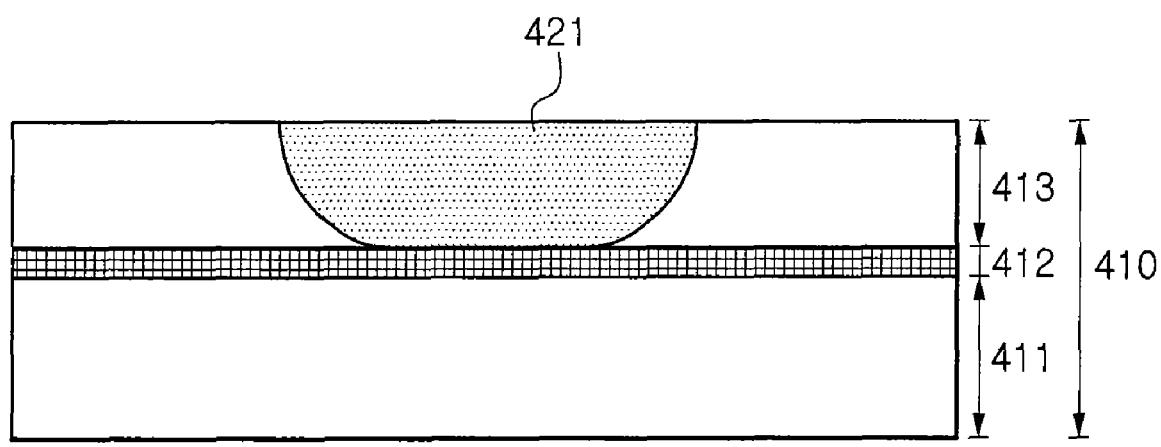
FIGS. 7A to 7D are cross-sectional views for explaining a method of manufacturing an uncooled IR sensor having the structure of FIG. 6.

Firstly, as shown in FIG. 7A, an n-type well 421 used to form a collector of the BJT 420 is formed in the p-type silicon 413 of the SOI wafer 410 through a general CMOS process.

Figure 7B:
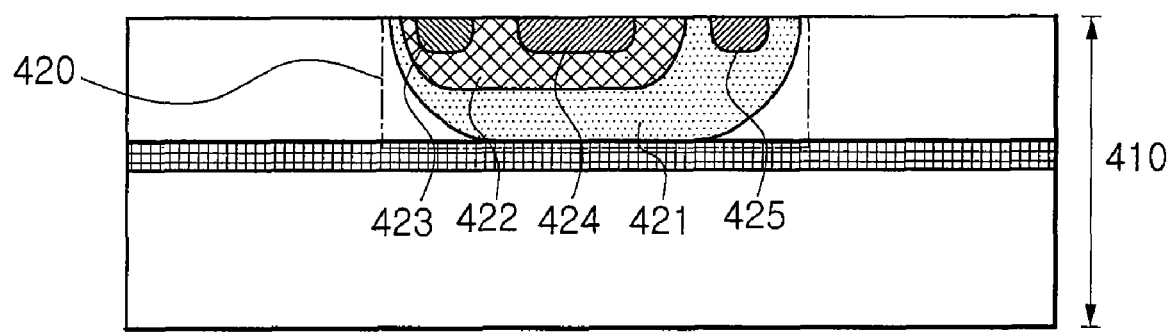

Next, as shown in FIG. 7B, a p-type base region 422 is formed in the n-type well 421 through a p-type base ion implantation process and a diffusion process. Next, a p-type base 423 and an n-type emitter 424 are formed in the p-type base region 422 through n+ active and p+ active ion implantation processes. Next, an n-type collector 425 is formed in the n-type well 421 where the p-type base region 422 is not formed.

As a result, the BJT 420 is formed to have an n+/p-type base/n-type well structure.

Figure 7C:
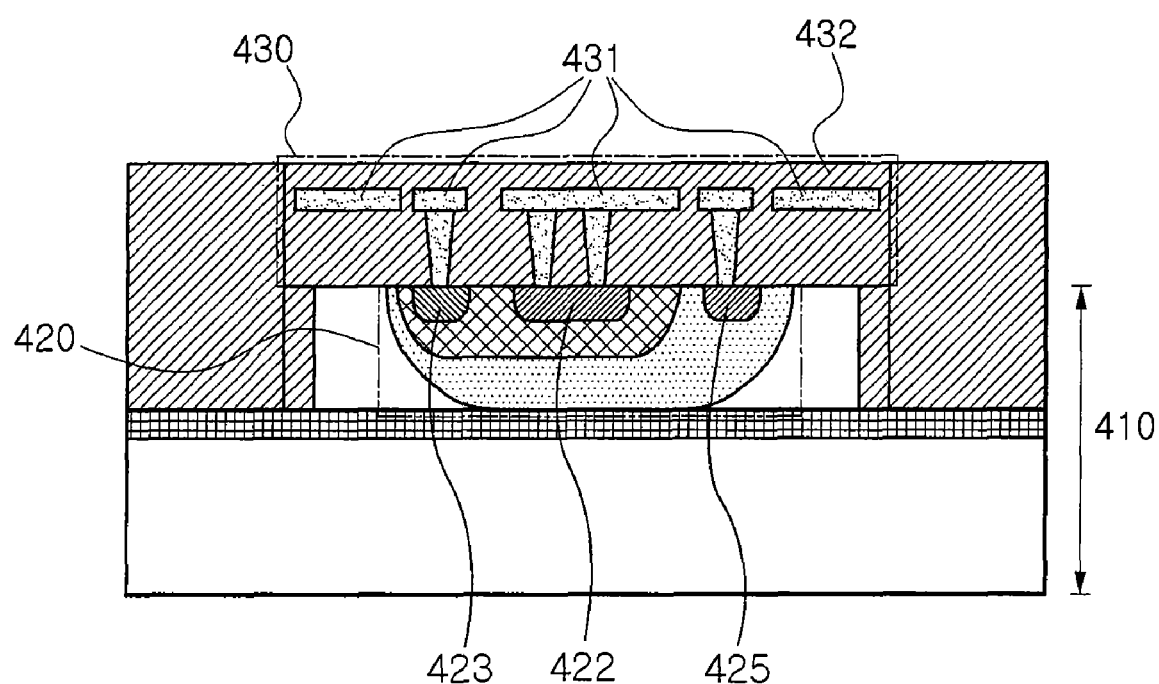

Next, as shown in FIG. 7C, metal interconnection lines 431 are formed to be connected to the p-type base 423, the n-type emitter 424, and the n-type collector 425 through a metal interconnection process. A passivation insulating layer 432 is deposited on the upper surface of the SOI wafer 410 so as to cover the metal interconnection lines 431.

Figure 7D:
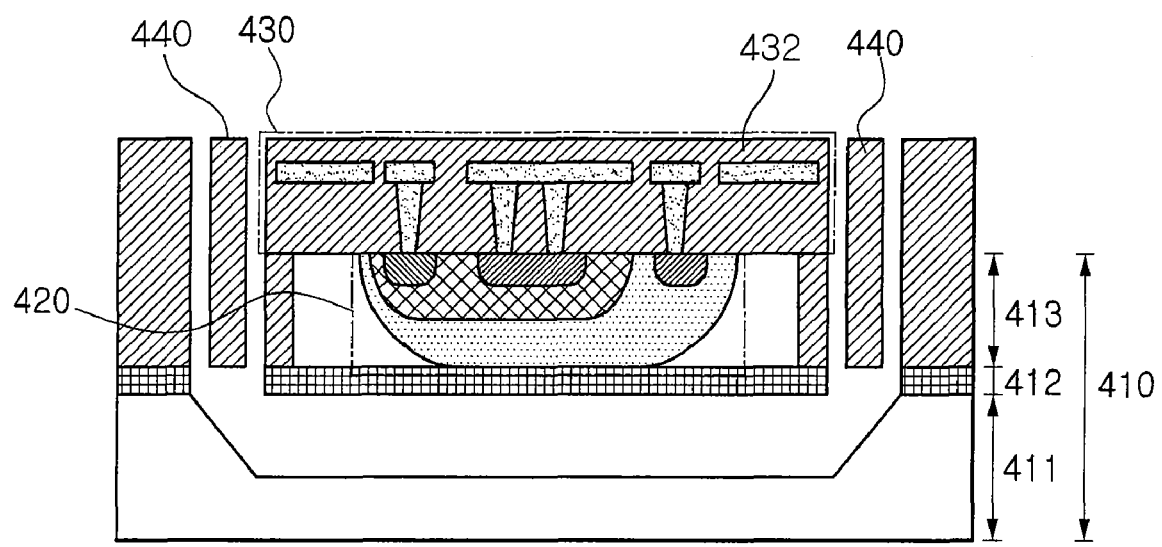

Next, as shown in FIG. 7D, an opening region of an insulating layer 432 is defined through a photolithography process, and the insulating layer 432 deposited on a portion corresponding to the opening region 340 is dry-etched. As a result, the heat absorption layer 430 constructed with the metal interconnection line 431 and the insulating layer 432 and the support arm 440 constructed with the insulating layer 432 are implemented.

Next, a wet etching process is performed on the silicon substrate 411 disposed on a lower surface of the BJT 420, so that the IR sensor structure constructed with the BJT 420 and the heat absorption layer 430 is formed to be floated apart from the silicon substrate 411.

In the aforementioned embodiment, the support arm 440 is constructed with only the insulating layer. Alternatively, the support arm 440 may be constructed in a combination of a polysilicon and the insulating layer similar to FIG. 2.

Figure 8A:
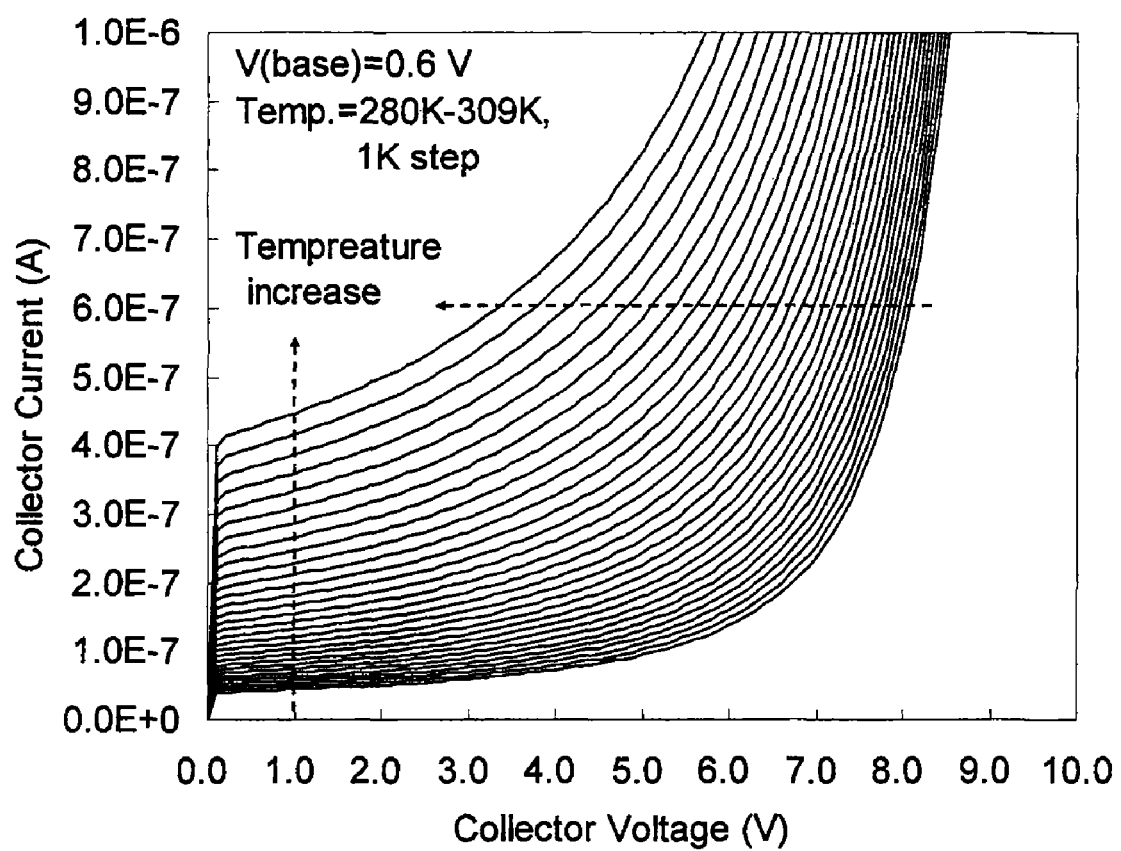
FIGS. 8A to 8C are graphs illustrating temperature change detection characteristics of an uncooled IR sensor according to the present invention.
Figure 8B:
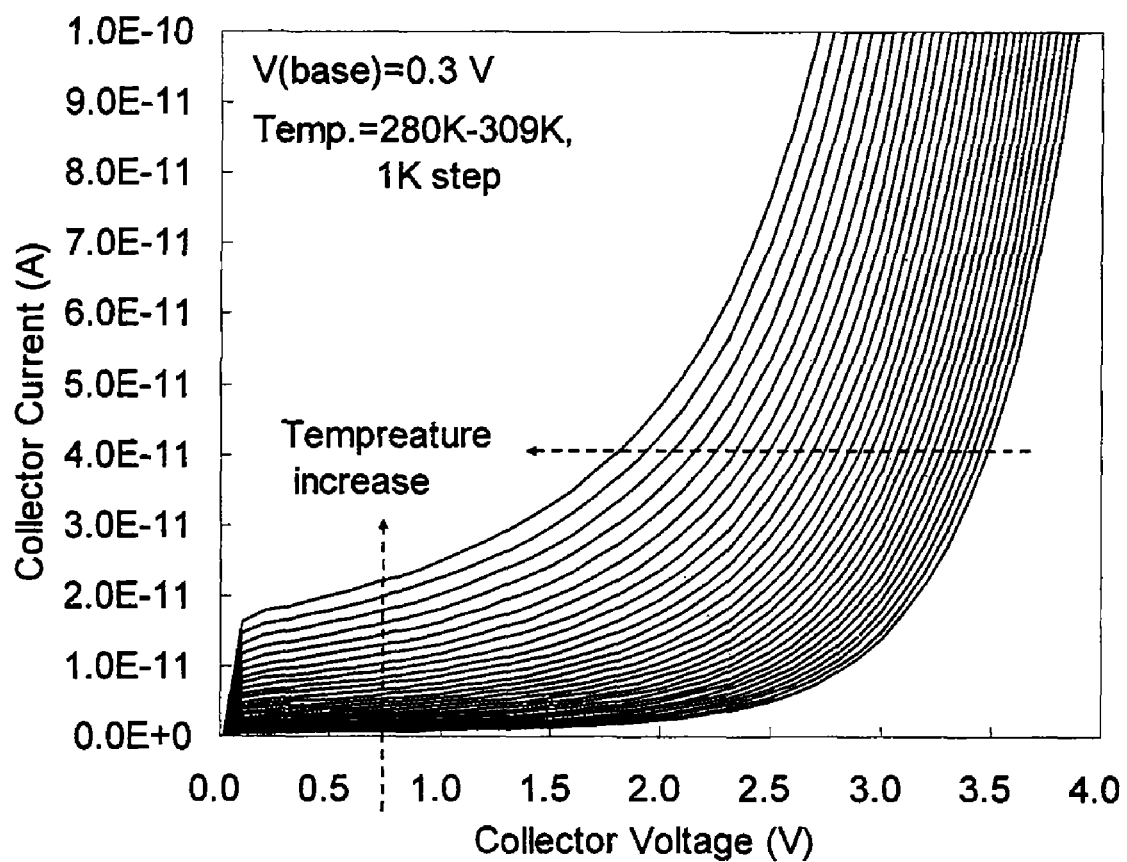
Figure 8C:
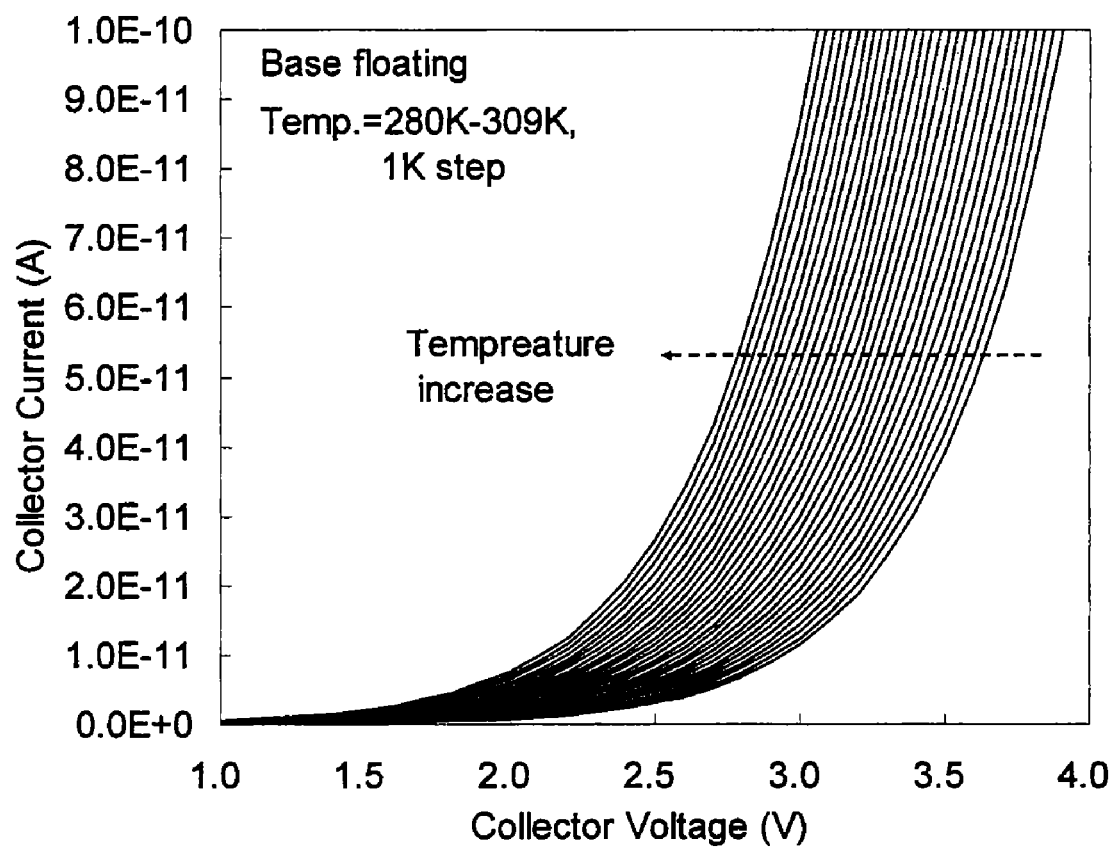

FIGS. 8A to 8C are graphs illustrating temperature change detection characteristics of an uncooled IR sensor according to the present invention. FIG. 8A illustrates a case where a base of a BJT is applied with a constant voltage of 0.6V and a collector voltage is changed. FIG. 8B illustrates a case where the base of the BJT is applied with a constant voltage of 0.3V and the collector voltage is changed. FIG. 8B illustrates a case where the base of the BJT is in a floating state and the collector voltage is changed.

The uncooled IR sensor having the structure of FIG. 2 is used. Areas of the emitter, base, and collector are designed to be 6, 7, and 8 $\mu m^{2t}$, respectively.

Referring to FIG. 8A, when the collector is applied with a constant voltage of 1V, a rate of change in collector current according to a temperature is about 8%/K. When the collector is applied with a constant current of $6 \times 10^{-7}$ A, a rate of change in collector voltage according to a temperature is very high value such as 150 mV/K (average). In addition, it can be seen that a rate of change in the collector voltage is proportional to the temperature.

Referring to FIG. 8B, when the collector is applied with a constant voltage of 0.75V, a rate of change in collector current according to a temperature is about 12%/K. When the collector is applied with a constant current of $4 \times 10^{-11}$ A, a rate of change in collector voltage according to a temperature is very high value such as 60 mV/K (average).

Referring to FIG. 8C, when the collector is applied with a constant voltage of 0.5V, a rate of change in collector current according to a temperature is about 10%/K. When the collector is applied with a constant current of $5 \times 10^{-7}$ A, a rate of change in collector voltage according to a temperature is very high value such as 33 mV/K. In addition, it can be seen that a rate of change in the collector voltage according to a temperature is constant.

In the BJT-based uncooled IR sensor according to the present invention, a rate of change in current according to a temperature is in a range of 8 to 12%/K, and a rate of change in voltage according to a temperature is in a range of 33 to 150 mV/K. Therefore, it can be seen that the BJT-based uncooled IR sensor has more excellent temperature change detection characteristics than conventional PN diode-based uncooled IR sensors or resistor-based uncooled IR sensors using such as a resistor $VO_x$.

According to a BJT-based uncooled IR sensor and a manufacturing method therefor according to the present invention, a heat detection device is implemented with a BJT instead of a PN diode, so that it is possible to obtain more excellent temperature change detection characteristics and to stably detect output signals in a wide range of operating voltage. In addition, it is possible for the BJT-based uncooled IR sensor to be compatible with a silicon CMOS process.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A bipolar junction transistor (BJT)-based uncooled IR sensor comprising:
   a substrate;
   at least one BJT which is formed to be floated apart from the substrate; and
   a heat absorption layer which is formed on an upper surface of the at least one BJT,
   wherein the BJT changes an output value according heat absorbed through the heat absorption layer, and
   wherein in the BJT, a base is applied with a constant voltage, a collector is applied with a constant voltage, and a current flowing through the collector is changed according to heat absorbed through the heat absorption layer.

2. A bipolar junction transistor (BJT)-based uncooled IR sensor comprising:
   a substrate;
   at least one BJT which is formed to be floated apart from the substrate; and
   a heat absorption layer which is formed on an upper surface of the at least one BJT,
   wherein the BJT changes an output value according heat absorbed through the heat absorption layer, and
   wherein in the BJT, a base is applied with a constant voltage, a collector is applied with a constant current, and a voltage applied to the collector is changed according to heat absorbed through the heat absorption layer.

3. A bipolar junction transistor (BJT)-based uncooled IR sensor comprising:
   a substrate;
   at least one BJT which is formed to be floated apart from the substrate; and
   a heat absorption layer which is formed on an upper surface of the at least one BJT,
   wherein the BJT changes an output value according heat absorbed through the heat absorption layer, and
   wherein in the BJT, a base is applied with a constant current, a collector is applied with a constant voltage, and a current flowing through the collector is changed according to heat absorbed through the heat absorption layer.

4. A bipolar junction transistor (BJT)-based uncooled IR sensor, comprising:
   a substrate;
   at least one BJT which is formed to be floated apart from the substrate; and
   a heat absorption layer which is formed on an upper surface of the at least one BJT,
   wherein the BJT changes an output value according heat absorbed through the heat absorption layer, and
   wherein in the BJT, a base is applied with a constant current, a collector is applied with a constant current and a voltage applied to the collector is changed according to heat absorbed through the heat absorption layer.

* * * * *